US012730162B2

(12) United States Patent
Solmeyer

(10) Patent No.: US 12,730,162 B2
(45) Date of Patent: Sep. 8, 2026

(54) RING RESONATOR MAGNETOMETER WITH ABSORBENT MATERIAL

(71) Applicant: Honeywell International Inc., Charlotte, NC (US)

(72) Inventor: Neal Eldrich Solmeyer, Edina, MN (US)

(73) Assignee: Honeywell Aerospace US LLC, Phoenix, AZ (US)

(*) Notice: Subject to any disclaimer, the term of this patent is extended or adjusted under 35 U.S.C. 154(b) by 145 days.

(21) Appl. No.: 18/680,898

(22) Filed: May 31, 2024

(65) Prior Publication Data

US 2025/0244414 A1 Jul. 31, 2025

Related U.S. Application Data

(60) Provisional application No. 63/626,227, filed on Jan. 29, 2024.

(51) Int. Cl.
*G01R 33/032* (2006.01)

(52) U.S. Cl.
CPC .................................. *G01R 33/032* (2013.01)

(58) Field of Classification Search
CPC .................................................... G01R 33/032
See application file for complete search history.

(56) References Cited

U.S. PATENT DOCUMENTS 10,288,701 B2 5/2019 Kobayashi et al.
10,766,632 B2 9/2020 Le Provost et al.
2017/0023654 A1 1/2017 Kobayashi et al.
2020/0158798 A1* 5/2020 Huck .................. G01R 33/032
2021/0033686 A1 2/2021 Garces Malonda et al.
2021/0278486 A1* 9/2021 Yamada ................. G01R 33/26
2022/0091200 A1* 3/2022 Gerginov ............... G01R 33/26
2023/0349989 A1 11/2023 Burchard et al.

FOREIGN PATENT DOCUMENTS

JP H0669583 A 3/1994
JP 4537218 B2 9/2010

OTHER PUBLICATIONS

Zhao, Binbin et al. "High-sensitivity pump-probe atomic magnetometer based on single fiber-coupled". Optics & Laser Technology 159, 2023, 109025. (Year: 2023).*
Sturner, Felix M. et al. "Integrated and portable magnetometer based on nitrogen-vacancy ensembles in diamond", Quantum Physics, Dec. 2, 2020. (Year: 2020).*
Chatzidrosos et al., "Miniature cavity-enhanced diamond magnetometer", Quantum Physics, Jun. 8, 2017, downloaded from https://arxiv.org/abs/1706.02201, pp. 1 through 6.
Katsporinakis et al., "High Frequency Atomic Magnetometer by Use of of Electromagnetically Induced Transparency", Physical Review Letters, Jan. 2007, vol. 97, pp. cover through 230801-4.

* cited by examiner

*Primary Examiner* — Michael A Lyons
(74) *Attorney, Agent, or Firm* — Fogg & Powers LLC

(57) ABSTRACT

Various embodiments are directed to, but not limited to, a magnetometer comprising a ring resonator and an absorbent material disposed in the ring resonator. The absorbent material is configured to absorb pump light propagating in the ring resonator when excited. By absorbing the pump light, the intensity of the output probe light from the ring resonator decreases, which is utilized to determine one or more characteristics of an external magnetic field.

19 Claims, 8 Drawing Sheets

RING RESONATOR MAGNETOMETER WITH ABSORBENT MATERIAL

CROSS-REFERENCE TO RELATED APPLICATIONS

This application claims the benefit of U.S. Provisional Application Ser. No. 63/626,227, filed Jan. 29, 2024, and titled "RING RESONATOR MAGNETOMETER WITH ABSORBENT MATERIAL", the contents of which are hereby incorporated herein by reference in their entirety.

BACKGROUND

A magnetometer is designed to determine the properties of an external magnetic field, and is valuable for inertial navigation assistance in many applications, particularly in aerial navigation. Magnetometers exist in many forms. Potential architectures for magnetometers utilizing a nitrogen vacancy (NV) venter in diamond include fluorescent detection schemes, IR absorption schemes, and threshold magnetometry. While fluorescent magnetometers require fewer lasers, and have shown the high sensitivities, they can require high numerical aperture collection lenses and large pump powers that may not be suitable for size, weight, and power (SWaP) reduction.

Some magnetometers operate by utilizing an NV diamond material to absorb probe light input into the resonator. The absorption of the probe light triggers a measurement event to determine the magnetic field properties based on other controlled properties of the sensor (e.g., radio frequency (RF) field scanning). NV diamond magnetometers have shown the potential to provide high sensitivity and stability in a low SWAP package, desirable in many applications. Magnetometers based on infrared (IR) absorption have the advantage of a directional probe beam that can be efficiently captured without the need for high numerical aperture optics. Magnetometers based on threshold lasing of the IR in a cavity that includes the diamond and a gain medium are promising for high sensitivity low SWAP devices, but suffer from stability issues owing to complex laser dynamics.

An optical cavity can be used to enhance the sensitivity by increasing the effective optical path length of the probe beam in the diamond. In addition, an optical cavity may be used to lower the power requirements of the pump laser by maximizing the efficiency of absorbing the pump photons. A linear cavity that is doubly resonant for pump and probe can be advantageous, but is limited by the ability to filter the pump light from reaching the probe light detector.

Accordingly, there is a need for a magnetometer that improves upon the weaknesses of existing magnetometers that utilize an absorbent material such as NV diamond.

SUMMARY

The details of one or more embodiments are set forth in the description below. The features illustrated or described in connection with one exemplary embodiment may be combined with the features of other embodiments. Thus, any of the various embodiments described herein can be combined to provide further embodiments. Aspects of the embodiments can be modified, if necessary to employ concepts of any patents, applications and publications as identified herein to provide yet further embodiments.

Various embodiments are directed to magnetometry techniques that utilize a ring resonator. The ring resonator receives both pump and probe light and is doubly resonant for both types of light. The ring resonator also includes an absorbent material disposed therein that absorbs the probe light when excited. The absorption of the probe light causes the intensity of the output light to decrease, which can be detected and used to determine one or more characteristics of an external magnetic field.

The techniques described in this disclosure realize the advantages of a doubly resonant cavity and dramatically reduces the filtering requirements by placing the absorbent material in a ring cavity, doubly resonant with the pump and probe beam counterpropagating in the ring. The counter propagation allows the output beams of the cavity to be spatially separated and can be used in conjunction with spectral filtering, to achieve high signal to noise measurements of the probe beam.

In one embodiment, a system is disclosed. The system comprises a probe light source configured to generate probe light. The system comprises a pump light source configured to generate pump light. The system comprises a ring resonator optically coupled to the probe light source and the pump light source. The ring resonator comprises a plurality of reflecting elements and an absorbent material. The system comprises at least one detector coupled to an output of the ring resonator. The at least one detector is configured to receive output light from the output of the ring resonator. The pump light is configured to propagate in the ring resonator at a first intensity and the probe light is configured to propagate in the ring resonator at a second intensity. The absorbent material, in response to optical contact from the pump light at an excitation frequency of the absorbent material, absorbs the probe light propagating in the ring resonator. The second intensity of the probe light changes in response to absorption of the probe light propagating in the ring resonator by the absorbent material. The at least one detector is configured to detect an intensity change of the output light corresponding to absorption of the probe light.

In another embodiment, an optical circuit is disclosed. The optical circuit comprises a probe light source configured to generate probe light, a pump light source configured to generate pump light, and a ring resonator optically coupled to the probe light source and the pump light source. The ring resonator comprises at least one reflecting element, and an absorbent material. The optical circuit comprises at least one detector coupled to an output of the ring resonator. The at least one detector is configured to receive output light from the output of the ring resonator. The pump light is configured to propagate in the ring resonator at a first intensity and the probe light is configured to propagate in the ring resonator at a second intensity. The absorbent material, in response to optical contact from the pump light at an excitation frequency of the absorbent material, absorbs the probe light propagating in the ring resonator. The second intensity of the probe light changes in response to absorption of the probe light propagating in the ring resonator by the absorbent material. The at least one detector is configured to detect an intensity change of the output light corresponding to absorption of the probe light.

In yet another embodiment, a method is disclosed. The method comprises receiving, at a ring resonator, probe light generated from a probe light source. The ring resonator comprises an absorbent material. The method comprises receiving, at the ring resonator, pump light at an excitation frequency of the absorbent material. The pump light and the probe light propagate in the ring resonator. The method comprises receiving radio frequency (RF) emission at a range of frequencies. The method comprises filtering the probe light from the pump light. The method comprises detecting an intensity change of the filtered probe light. The method comprises determining one or more characteristics of an external magnetic field based on the intensity change of the filtered probe light.

These and other features of the systems and methods of the subject disclosure will become more readily apparent to those skilled in the art from the following detailed description of the preferred embodiments taken in conjunction with the drawings.

BRIEF DESCRIPTION OF THE DRAWINGS

Understanding that the drawings depict only exemplary embodiments and are not therefore to be considered limiting in scope, the exemplary embodiments will be described with additional specificity and detail through the use of the accompanying drawings, as subsequently described and as described in conjunction with the detailed description.

Figure 1:
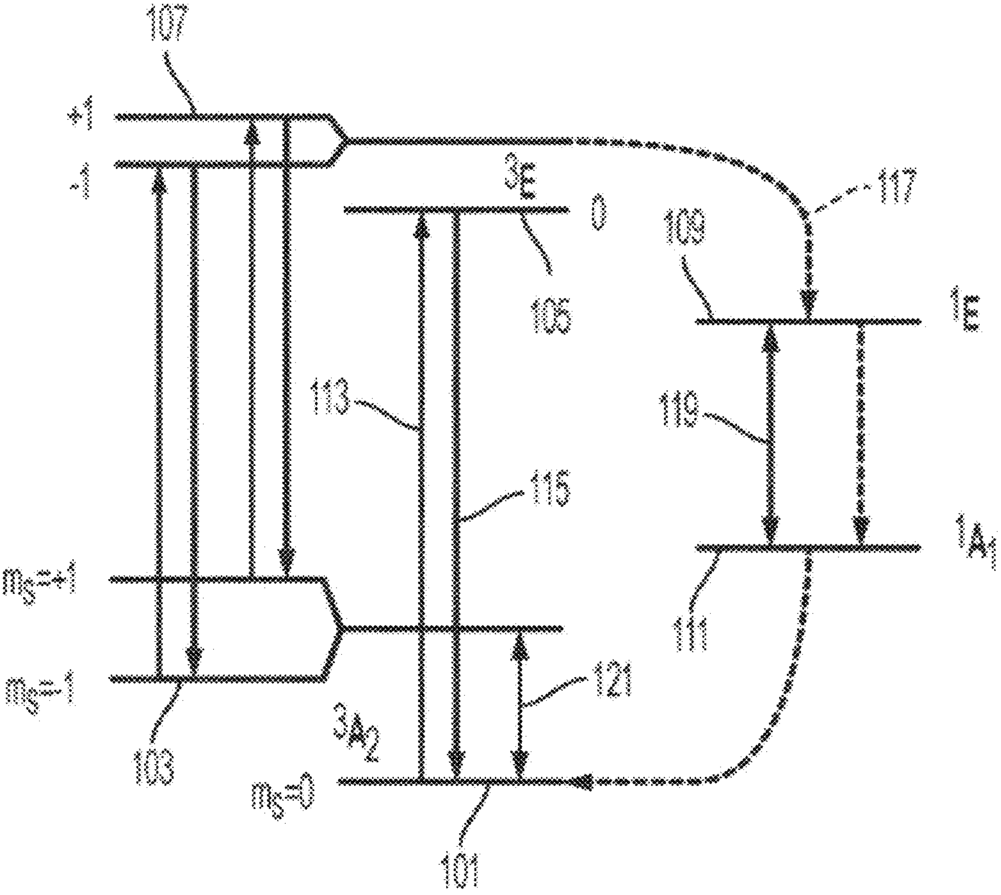
FIG. 1 depicts a diagram illustrating transitions between the various states of an absorbent material used for fabricating a magnetometer.

In accordance with common practice, the various described features are not drawn to scale but are drawn to emphasize specific features relevant to the exemplary embodiments.

DETAILED DESCRIPTION

In the following detailed description, reference is made to the accompanying drawings that form a part hereof, and in which is shown by way of illustration specific illustrative embodiments. However, it is to be understood that other embodiments may be utilized and that logical, mechanical, and electrical changes may be made. Furthermore, any methods presented in the drawing figures and the specification are not to be construed as limiting the order in which the individual steps may be performed. The following detailed description is, therefore, not to be taken in a limiting sense.

Systems and methods for magnetometry are presented comprising an absorbent material in a ring resonator of a laser magnetometer. In exemplary embodiments, the absorbent material is a diamond-based material with nitrogen vacancy centers, such as NV diamond (but can include other materials, for example, silicon carbide). The absorbent material can absorb light propagating within the ring resonator at one or more resonant frequencies, thereby reducing the output power level of the ring resonator. The absorption rate of the absorbent material can be modified based on a range of frequencies emitted by a transmitter. Based on the transmission frequency at which the photons in the ring resonator are absorbed, one or more characteristics of a magnetic field can be determined. By including an absorbent material in the ring resonator and measuring the output power, the probe light circulating in the cavity for several passes, effectively increasing the optical path length of the probe in the diamond, allowing for a higher contrast measurement, and therefore higher sensitivity measurement. Also, the structured configuration of the laser magnetometer as described herein improves the stability of conventional magnetometers utilizing NV diamond so that the advantages of utilizing NV diamond or similar absorbent material can be utilized with a more reliable resonator apparatus.

FIG. 1 is a diagram illustrating transitions between the various states of an exemplary absorbent material used for fabricating a magnetometer. For example, some materials have certain physical characteristics that allow the material to be responsive to magnetic fields. The absorbent material may be a nitrogen vacancy (NV) diamond, silicon carbide with defect centers, or other material having addressable energy levels that are sensitive to a magnetic field. As used herein, NV diamond refers to a diamond-based material having multiple point defects where a point defect includes a nearest-neighbor pair of a nitrogen atom substituted for another atom (say, a carbon atom) and a lattice vacancy. Such a material can be fabricated in the ring resonators of the laser magnetometers described herein.

As illustrated, the absorbent material may have a ground state that is a spin triplet state. The ground state may have multiple spin projections: a ground antiparallel 101 of spin projection 0 and ground parallel spins 103 with spin projections of +/−1, where the ground antiparallel spins 101 and the ground parallel spins 103 are separated by a resonant frequency 121. In the absence of a magnetic field, when the absorbent material is NV diamond, the resonant frequency is approximately 2.87 GHz. Additionally, the point defects within the absorbent material may be optically excited through spin conserving transitions to a spin triplet excited level, where the triplet excited level also has multiple spin projections: an excited antiparallel spin 105 of spin projection 0 and excited parallel spins 107 with spin projections of +/−1. To optically excite the point defects, the absorbent material may be exposed to a pump light having a particular frequency. For example, in NV diamond, laser light having a wavelength of 532 nm may cause spin conserving transitions from the ground triplet state to the excited triplet states.

When the point defects within the absorbent material are at the excited state, the defects relax either through a radiative transition 115 or through an intersystem crossing 117. When the point defects relax through a radiative transition 115, the point defects fluoresce and return to the ground triplet states. For example, NV diamond point defects generally emit light having a wavelength of 637 nm during radiative transitions 115. When a point defect relaxes through an intersystem crossing 117, the point defect will not fluoresce and will transition to a shelved state, where the shelved state is a shelved ground state 111 or a shelved excited state 109. Additionally, when the point defects are in one of the shelved states 109 and 111, the point defects absorb probe light 119 having a particular frequency. For example, NV diamond point defects in the shelved states 109 and 111 absorb probe light 119 having a wavelength of 1042 nm.

In some implementations, a low-energy radiation field is applied to the absorbent material to increase the rate of intersystem crossings 117. Such a low energy radiation field can include light at a frequency range in the radio frequency (RF) range of the electromagnetic spectrum. As used herein, RF light also includes light in the microwave range of the electromagnetic spectrum, and microwave light is described as a particular example of the RF spectrum. For a NV diamond material, a microwave frequency resonant with the transition 121 is applied to the absorbent material to increase the rate of intersystem crossings 117 as compared to radiative transitions 115. In the absorbent material, non-radiative intersystem crossings 117 may be strongly spin selective. For example, point defects having parallel spins 107 are more likely to experience an intersystem crossing 117 to the shelved states 109 and 111. In contrast, point defects having excited antiparallel spins 105 are more likely to experience a radiative transition back to the ground triplet state. To increase the probability of intersystem crossings, a microwave frequency is applied to the absorbent material equal to the resonant frequency for the absorbent material. For example, when the absorbent material is NV diamond (resonant frequency approximately 2.87 GHZ), applying a frequency of 2.87 GHz to the absorbent material will increase the probability of intersystem crossings 117 to the shelved states 109 and 111.

Additionally, when a microwave signal at the resonant frequency is applied to the absorbent material, the probe light 119 is more likely to be absorbed by the absorbent material as the population of point defects at the shelved states 109 and 111 within the absorbent material is greater than when the absorbent material is not exposed to the energy at the resonant frequency. Accordingly, when the probe light 119 is applied to the absorbent material in the absence of the microwave signal at the resonant frequency, the probe light 119 is not absorbed by the absorbent material as efficiently. For example, when a NV diamond material is exposed to a microwave signal having a frequency of 2.87 GHZ, the NV diamond material begins to absorb probe light 119 having a wavelength of 1042 nm at an increased rate.

In some implementations, the resonant frequency for the absorbent material changes in the presence of a magnetic field. For example, when the absorbent material is exposed to a magnetic field, the Zeeman effect causes the resonant frequency to experience a shift in proportion to the strength of the experienced magnetic field. In the presence of a magnetic field, the resonance frequency splits into two different resonant frequencies, where the difference between the two resonant frequencies is proportional to the applied magnetic field. This splitting behavior is depicted in the ms=+1 and ms=−1 states of level 103 in FIG. 1. Accordingly, the resonant frequency at which the probe light 119 is absorbed by point defects in the absorbent material can be monitored to determine the strength of a magnetic field experienced by the absorbent material.

In some implementations, the point defects within the absorbent material are in one of multiple different orientations. For example, when the absorbent material is NV diamond, each point defect can be in one of four different orientations. The absorbent material can have many point defects in each of the four different orientations. Accordingly, vector information for a magnetic field is extracted from the absorbent material when probe light 119 is applied to the absorbent material. For example, when the absorbent material is exposed to a magnetic field, the resonant frequencies for a point defect shift based on the orientation of the point defect in relation to the experienced magnetic field. When the point defects in the absorbent material are in multiple different orientations, the point defects in the absorbent material have separate resonant frequencies associated with each of the different orientations of the point defects. Therefore, characteristics such as the vector information for the magnetic field is determined by identifying which resonances correspond to the different orientations of the point defects in the absorbent material. In some implementations, biased magnetic fields are applied to the absorbent material to aid in determining which resonance frequencies are associated with particular orientations of the point defects.

In the examples described herein, the absorbent material is incorporated within a magnetometer that exposes the absorbent material to a pump light 113 to cause the point defects within the absorbent material to move to the excited triplet state. The magnetometer may also expose the absorbent material to RF energy in a range of frequencies that includes the resonant frequency 121 for the absorbent material, where a probability of intersystem crossings 117 to shelved states 109 and 111 increases at the resonant frequency 121 as described above. Additionally, the absorbent material is exposed to probe light 119, where the probe light 119 is absorbed by point defects in the shelved states 109 and 111. Accordingly, an applied microwave signal is swept through a range of frequencies to identify the resonant frequenc(ies) associated with the different orientations of the point defects within the absorbent material. The resonant frequencies may be identified when the intensity of the applied probe light 119 that passes through the absorbent material decreases, indicating that the applied probe light 119 was absorbed by the point defects within the absorbent material. Based on the identified resonant frequencies, a magnetic field experienced by the absorbent material may be calculated with high sensitivity to magnetic field changes; low size, weight, and power; and a robustness that could enable the use of a resulting magnetometer in many magnetic based or aided applications such as in navigation.

Figure 2:
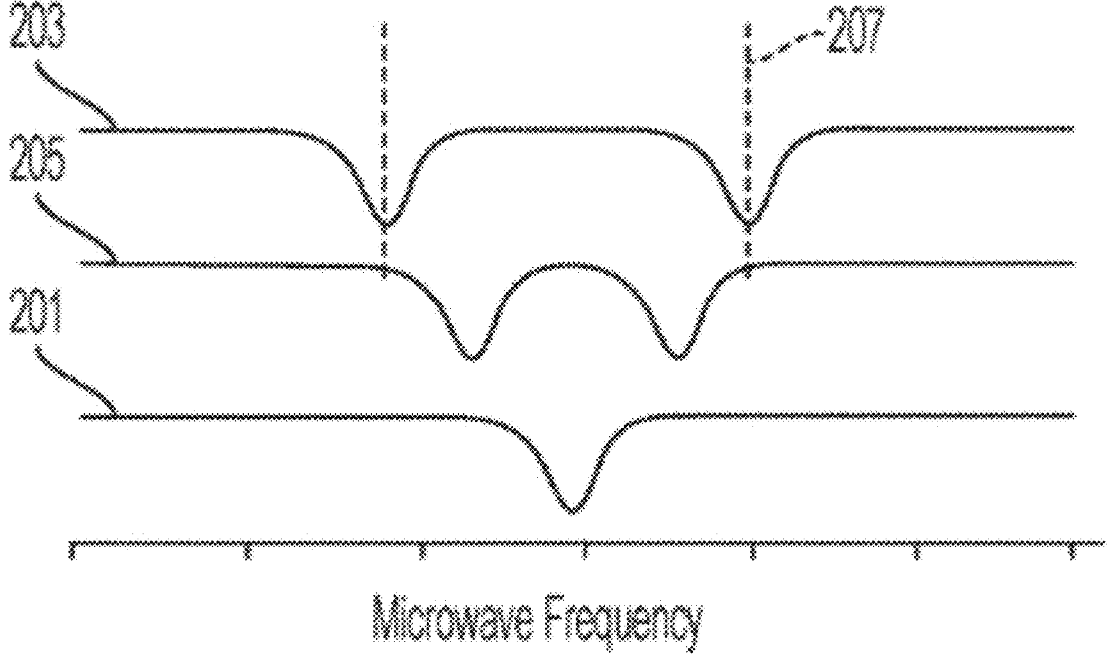
FIG. 2 depicts a graph illustrating the detection of an external magnetic field based on the identification of resonance lines in an applied RF field.

FIG. 2 is a graph illustrating the detection of a magnetic field based on the identification of resonance lines in an applied microwave field that is swept through a range of frequencies. As previously described, an absorbent material may be exposed to a range of microwave frequencies, where the range of applied frequencies includes the different resonant frequenc(ies) for the absorbent material. Additionally, the different resonant frequencies are associated with the strength of the magnetic fields experienced by the absorbent material. The absorbent material may also have different resonant frequencies associated with the different orientations of point defects within the absorbent material.

As illustrated, FIG. 2 shows various graphs of the intensity of a probe laser as transmitted through the absorbent material at different microwave frequencies applied to the absorbent material for three different magnetic field strengths. Intensity curve 201 shows the intensity of the transmitted probe source at different frequencies when the absorbent material is not exposed to a magnetic field. When light from a probe source is coupled into the absorbent material in the absence of an applied magnetic field, the absorbent material will not experience a Zeeman resonance shift and the probe light 119 will be absorbed at the single resonant frequency for the absorbent material. Accordingly, the intensity 201 of the transmitted light may decrease at the single resonant frequency for the absorbent material.

But when the absorbent material is exposed to different magnetic field strengths, the resonant frequency may experience a frequency shift in proportion to the experienced magnetic field strength. For example, intensity curve 205 and intensity curve 203 illustrate an intensity of the transmitted probe light 119 by the absorbent material in the presence of different magnetic field strengths. For example, the magnetic field strength experienced by the absorbent material associated with intensity curve 203 is greater than the magnetic field strength experienced by the absorbent material described by intensity curve 205. Accordingly, the magnitude of the shift of the resonant frequencies is greater when the absorbent material is exposed to a greater magnetic field strength. To identify the magnitude of the shift of the resonant frequency, a system (e.g., processing system 410) identifies the frequencies 207 associated with detected changes in the intensity of the probe light 119 emitted by the absorbent material. Based on the magnitude of the shift of the resonant frequency, a system determines the magnetic field experienced by a point defect. Additionally, when there are multiple resonant frequencies, the system may identify the orientations of the point defects associated with the different resonant frequencies and the direction of the experienced magnetic field.

Figure 3:
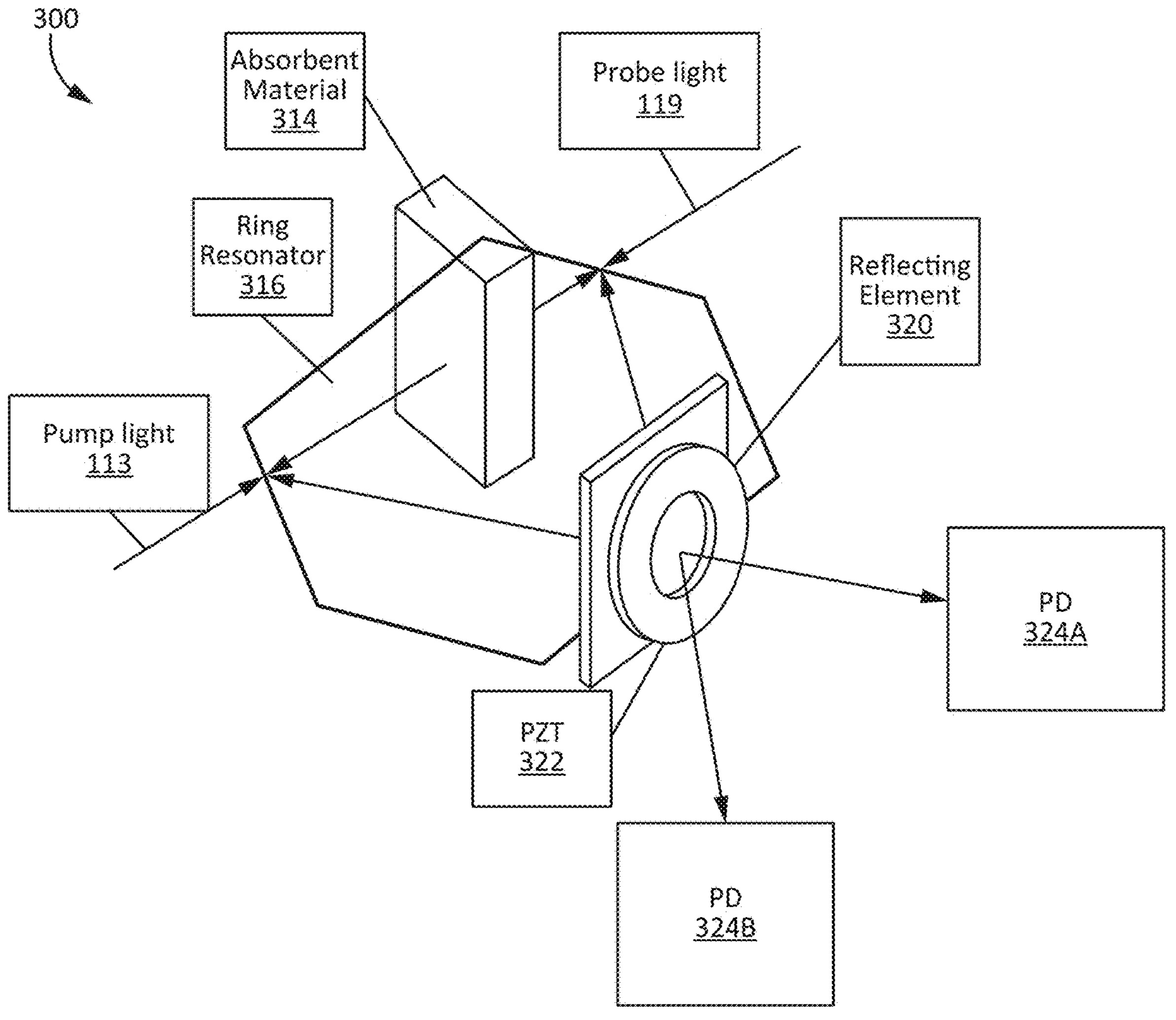
FIG. 3 depicts a diagram of a ring resonator used in a magnetometer, as described in one or more embodiments.

FIG. 3 depicts a diagram of a resonator 300 used in a magnetometer that utilizes the properties of the absorbent material described in FIGS. 1-2. Resonator 300 includes a ring resonator 316 that receives both the pump light 113 and the probe light 119 from respective light sources (not shown in FIG. 3) outside of the ring resonator 316. In some embodiments, such as shown in FIG. 3, the pump light 113 and probe light 119 enter in different places of the ring resonator 316. However, the pump light 113 and probe light 119 may enter the ring resonator 316 in the same place, for example, at different incident angles. Having the pump light 113 and probe light 119 enter at different places in the ring resonator 316 improves the stability of the propagating light in the resonator 300.

Ring resonator 316 is doubly resonant for both the entering probe light 119 and pump light 113. Thus, both the probe light 119 and pump light 113 are intensified while propagating in the ring resonator 316. The ring resonator 316 is structured in a ring-like configuration so that the resonant pump light 113 and probe light 119 propagate via incidence on the ring resonator 316 walls. The use of ring resonator 316 is advantageous over other resonators (e.g., a Fabry-Perot resonator) because it enables easier separation of the probe light 119 and the pump light 113 after exiting the ring resonator 316. As shown in FIG. 3, both the pump light 113 and probe light 119 beams overlap in the ring resonator 316, without substantial cross-interaction between the two propagating beams.

Although not explicit in FIG. 3, in some embodiments, ring resonator 316 comprises a gain material that is configured to undergo a nonlinear photon generation process to generate light having a different frequency from the frequency of the entering or propagating probe light 119. In these embodiments, the gain material includes nonlinear optical properties that may depend on the intensity of the probe light 119. When the intensity of the probe light 119 increases above a threshold power level, the high intensity of the probe light 119 triggers the nonlinear optical properties of the gain material and causes the gain material to generate photons that satisfy the resonance condition of the ring resonator 316. Various nonlinear photon generation processes can be used, such as stimulated Brillouin scattering (SBS), optical frequency comb formation, or others, to excite the entering probe light 119. Each nonlinear photon generation process may correlate with a different threshold power level that triggers the desired nonlinear properties of the ring resonator 316. In the case of SBS, a single additional wavelength greater than that of the probe light 119 will be produced, and in the case of optical frequency comb generation, many periodically spaced wavelengths will be produced. So long as the intensity of the light remains at the threshold power level, ring resonator 316 continues to generate output light at a frequency different than the frequency of the probe light 119.

Ring resonator 316 also includes an absorbent material 314 disposed in the resonator, such as NV diamond. The absorbent material 314 absorbs the probe light 119 propagating in the ring resonator 316 when excited. In the absence of an external magnetic field, absorbent material 314 absorbs probe light 119 at a single resonant frequency, but depending on the composition and orientation of the point defects in the absorbent material 314, can absorb probe light 119 at multiple resonant frequencies when exposed to an external magnetic field.

The absorbent material 314 can also possess nonlinear optical characteristics, such as a nonlinear optical susceptibility, that triggers upon exciting the absorbent material 314 to an excited state. In an excited state, absorbent material 314 absorbs the probe light 119 propagating in ring resonator 316, thereby decreasing the intensity of the probe light 119. Doing so causes the power level of the probe light 119 to fall below the threshold power level needed for the ring resonator 316 to undergo the nonlinear photon generation process previously described. As a result, the ring resonator 316 is no longer able to generate photons in this manner, and the output light from the ring resonator 316 noticeably decreases in intensity.

Coupled to the ring resonator 316 is reflecting element 320, which can be a mirror. Reflecting element 320 is configured to reflect at least a portion of the pump light 113 and probe light 119. However, reflecting element 320 also comprises a non-zero transmittance, so that some of the pump light 113 and probe light 119 can pass through the reflecting element 320 and out of the ring resonator 316. In some embodiments, one or more of the reflecting elements 320 can have a curved surface. A piezoelectric material, represented in FIG. 3 as a lead zirconate titanate (PZT) crystal, 322, which can be jointly attached to the output of reflecting element 320, can be used to tune the length of the optical cavity for slow-feedback to keep the resonator in resonance with either the pump or the probe.

Advantageously, the ring resonator with counter-propagating pump and probe enables the beams to be separated by spatial filtering, in addition to spectral filtering techniques.

In the embodiment of FIG. 3, two photodetectors (PD) (e.g., photodiodes) are optically coupled to the output of the ring resonator 316. A first photodetector 324A receives the output probe light 119, while a second photodetector 324B receives the output pump light 113. When the absorbent material 314 is excited and absorbs the probe light 119, the intensity of the optical signal received by photodetector 324A will decrease accordingly. Each photodetector 324A, 324B is configured to generate an electrical signal proportionate to the intensity of the respective optical signal that is received, to be further processed for analysis of the characteristics of an external magnetic field.

Additionally, fast feedback to keep both the pump source and probe source in resonance with the ring cavity 316 can be provided by feedback to the current of the two sources. The pump monitor photodiode 324B provides the signal for the feedback loop (not shown) to lock the pump source to the ring cavity 316. The signal photodiode 324A can be used to lock the probe source to the ring cavity 316 by appropriately filtering the resonant dips (as seen in FIG. 2) from the feedback signal from the probe source.

By implementing the ring resonator 316 configuration in the present disclosure, the following advantages are afforded. First, when infrared (IR) absorption is used, as in the case of NV diamond, the collection optics (e.g., reflecting element 320 and additional output optics) do not require a high numerical aperture, as would be needed for other NV diamond laser magnetometers. Second, the use of a single ring resonator 316 that is doubly resonant for both probe light 119 and pump light 113 improves the SWAP of the magnetometer. Third, the ring resonator 316 increases the optical path length of the probe light 119, thereby enhancing the signal-to-noise ratio for the filtered probe light 119. Fourth, the ring resonator 316 improves the efficiency of the pump light 113, which lowers power consumption of the magnetometer.

Figure 4:
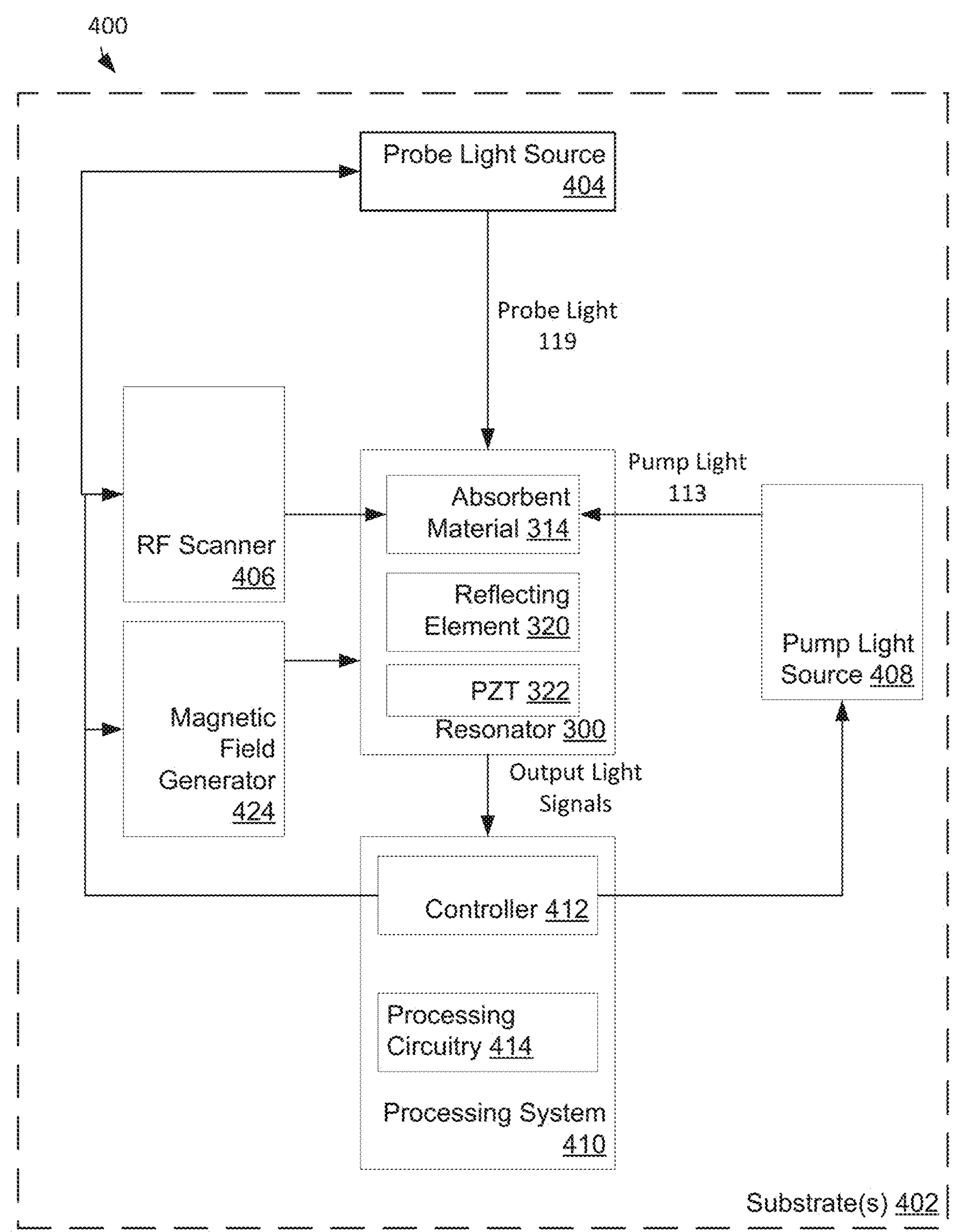
FIG. 4 depicts a block diagram of a magnetometer, as described in one or more embodiments.

FIG. 4 depicts a block diagram of an exemplary magnetometer 400 that includes the ring resonator 316 described in conjunction with FIG. 3. Magnetometer 400 is implemented on one or more substrate(s) 402, such as an integrated photonics chip. Some or all of the components described in FIG. 4 may be implemented on a silicon carrier wafer. Disposed on the substrate 402 is resonator 300, which is optically coupled to probe light source 404, pump light source 408, RF scanner 406, magnetic field generator 424, and processing system 410.

Probe light source 404 is configured to generate the probe light 119 entering the resonator 300. In one example, probe light source 404 is a laser source that generates probe light 119 at an infrared wavelength 1042 nm. Pump light source 408 is configured to generate the pump light 113 that excites the absorbent material 314, which as an example, can be 532 nm light for an NV diamond. An RF scanner 406 radiates the sweeping RF field to the absorbent material 314 near the resonant frequency of the absorbent material 314. Since the resonant frequency may be shifted, RF scanner 406 radiates the RF field in a range of frequencies with suitable sensitivity to include each shifted resonant frequency induced by an external magnetic field. Magnetic field generator 424 (e.g., one or more Helmholtz field coils) is configured to generate a biased magnetic field to the resonator 300 to assist in detecting the resonant frequency shifts experienced by the point defects of the absorbent material 314 from an external magnetic field.

Processing system 410 is coupled to the output of resonator 300 (namely, photodetectors 324) and is configured to determine one or more characteristics of an external magnetic field based on the intensity of the output light. For example, processing system 410 includes processing circuitry 414 that receives the electrical output light signal from detector 324 signifying the intensity of the probe light 119. Processing system 410 uses the amount of absorption of the probe light 119 as determined by the intensity of the output light signal, and optionally the corresponding frequencies emitted by RF scanner 406 (indicative of the shifted resonance frequencies of the absorbent material 314), to determine the magnetic field characteristics, including the strength and vector orientation of the field components relative to an inertial reference frame. Processing system 410 also includes a controller 412, which can output control signals to RF scanner 406 (e.g., to control the range of frequency scanning to the resonator 300) and to magnetic field generator 424 (e.g., to control the biased magnetic field to the resonator 300). Additionally, controller 412 can be used to control the feedback loop between the photodiodes 324A, 324B, the pump light source 408, and the probe light source 404 to remain frequency locked to the resonance of the ring resonator 316.

Processing circuitry 414 and controller 412 may include any one or combination of processors, microprocessors, digital signal processors, application specific integrated circuits, field programmable gate arrays, and/or other similar variants thereof. Processing system 410 and its associated components may also include, or function with, software programs, firmware, or other computer readable instructions for carrying out various process tasks, calculations, and control functions, used in the methods described below. These instructions are typically tangibly embodied on any storage media (or computer readable media) used for storage of computer readable instructions or data structures.

Figure 5:
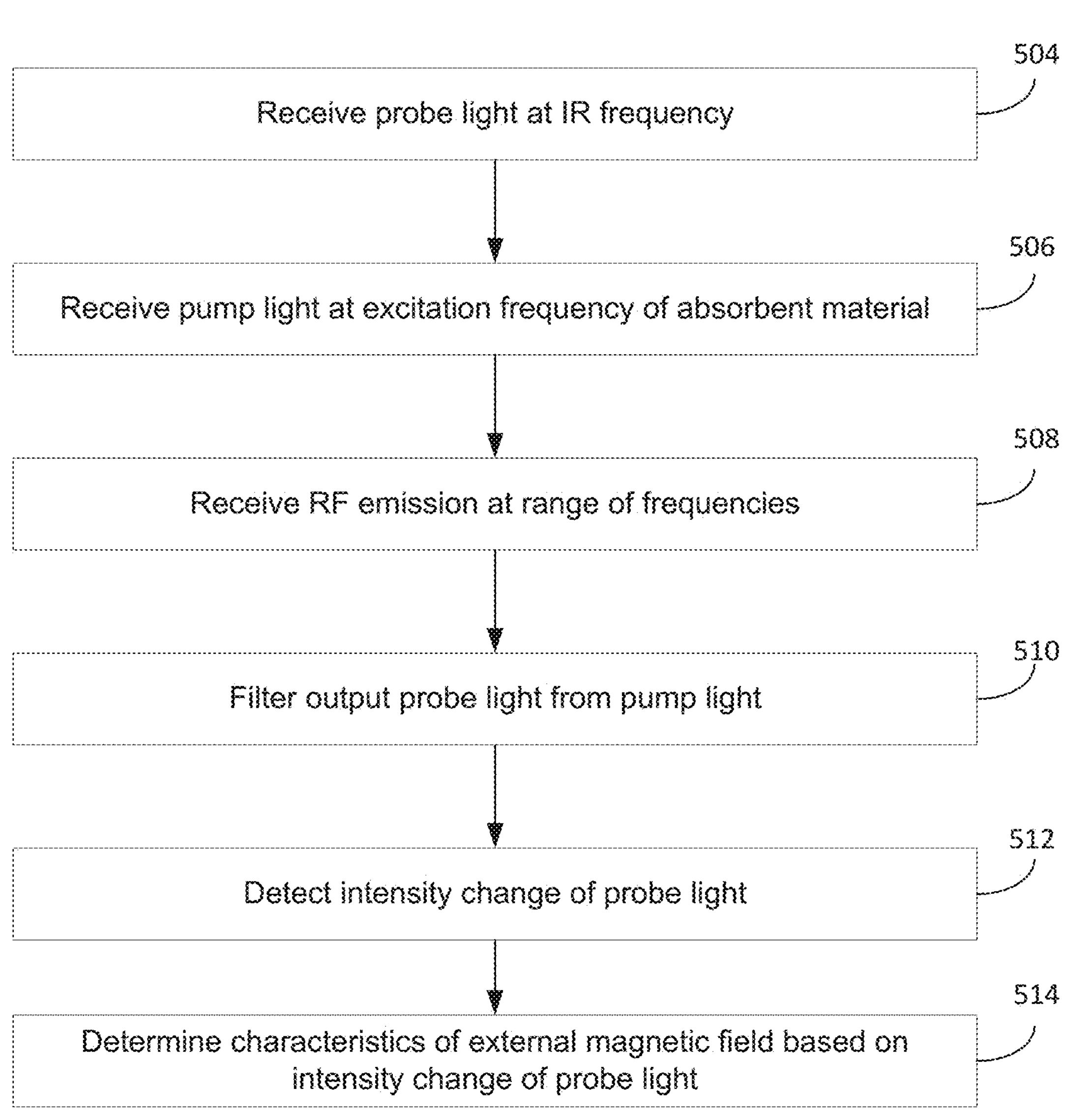
FIG. 5 depicts a flow diagram of a method for operating a ring resonator magnetometer, as described in one or more embodiments.

FIG. 5 depicts a flow diagram of a method 500 for operating a ring resonator magnetometer. Method 500 may be implemented via the techniques described with respect to FIGS. 1-4, but may be implemented via other techniques as well. The blocks of the flow diagram have been arranged in a generally sequential manner for case of explanation; however, it is to be understood that this arrangement is merely exemplary, and it should be recognized that the processing associated with the methods described herein (and the blocks shown in the Figures) may occur in a different order (for example, where at least some of the processing associated with the blocks is performed in parallel and/or in an event-driven manner).

Method 500 includes receiving probe light e.g., at an infrared frequency at block 504. In some embodiments, the probe light 119 is received from a probe light source 404 external to the resonator 300 through an optical port. One such example is receiving the probe light at a wavelength of 1042 nm by a probe laser.

Proceeding to block 506, method 500 receives pump light at an excitation frequency of the absorbent material disposed in the ring resonator 316, such as NV diamond. Also, at block 508, method 500 receives radio frequency emission from an RF scanner 406. The radio frequency emission is radiated from RF scanner 406 from a range of frequencies, where one or more frequencies are the resonant frequency of the point defects of the absorbent material 314. Where an external magnetic field is present, there may be additional resonant frequencies resulting from the Zeeman splitting of the spin states of the point defects in the absorbent material 314.

Method 500 then proceeds to block 510 and filters the output probe light from the pump light. Referring to FIG. 3, this can be accomplished by coupling a reflecting element 320 and a PZT 322 at the output of the ring resonator 316. The reflecting element 320 spatially separates the probe light 119 from the pump light 113, while the PZT 322 adjusts the optical path length of the ring resonator 316 to filter out excess noise from the output light signal.

At block 512, method 500 detects an intensity change of the output light. This step can be performed by processing and/or control circuitry coupled to the resonator 300. In one embodiment, the resonator 300 includes one or more detectors 324 that collects the output light from ring resonator 316. When the absorbent material 314 absorbs the probe light 119, the intensity of the probe light 119 as detected by the detector(s) 324 will decrease as a result of the IR absorption by the absorbent material 314. A processing system uses the detected change in intensity and the frequenc(ies) from the RF scanner 406 to determine one or more characteristics of an external magnetic field experienced by the magnetometer at block 514. Such characteristics can include vector information and magnitude of the magnetic field.

Figure 6:
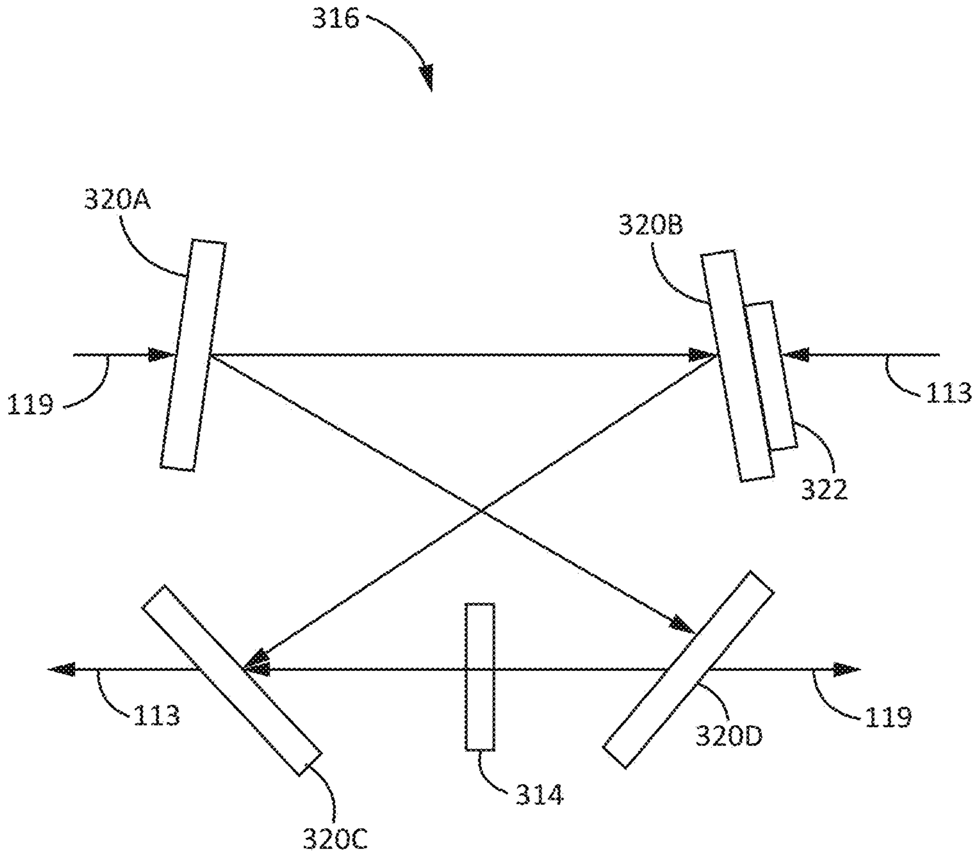
FIG. 6 depicts a diagram of an alternative ring resonator used in a magnetometer, as described in one or more embodiments.
Figure 7B:
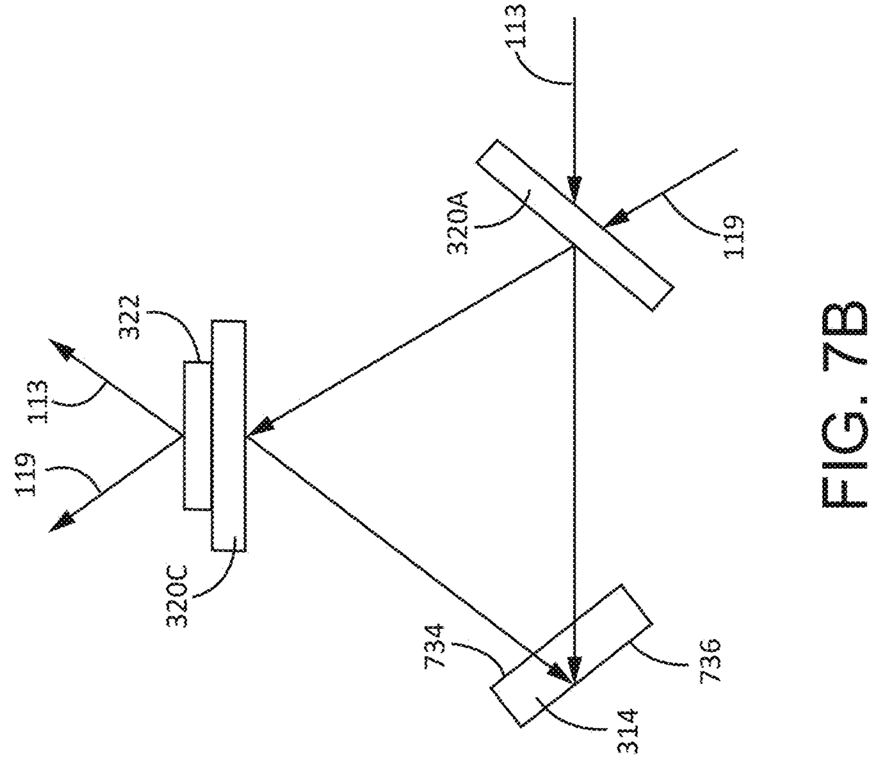
FIGS. 7A-7B depict comparative diagrams of two ring resonators that can be used in a magnetometer, as described in one or more embodiments.
Figure 7A:
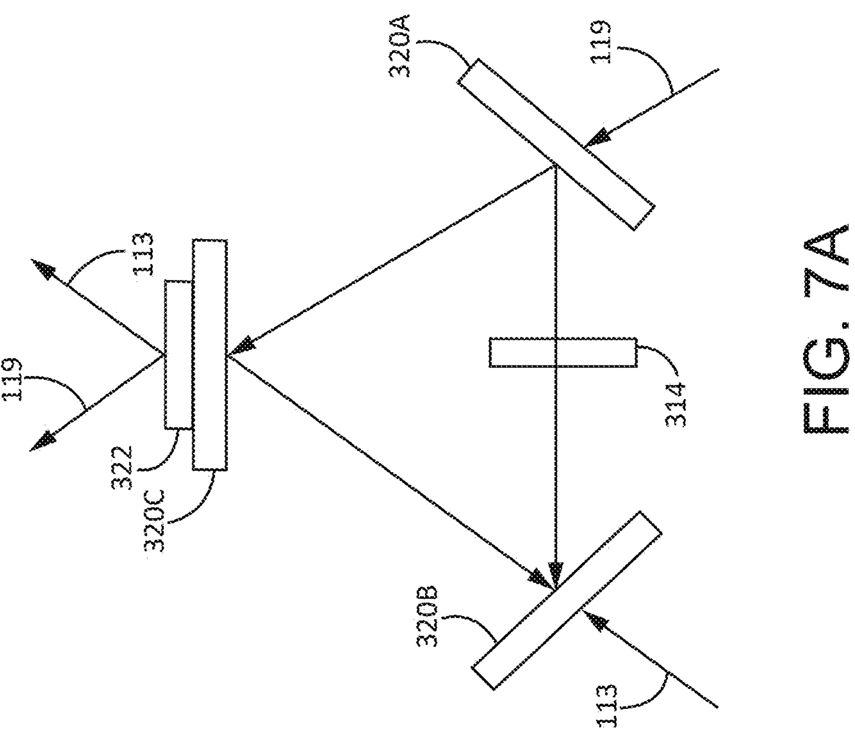
Figure 8:
FIG. 8 depicts a diagram of a ring resonator used in a magnetometer, as described in one or more embodiments.
Figure 8:
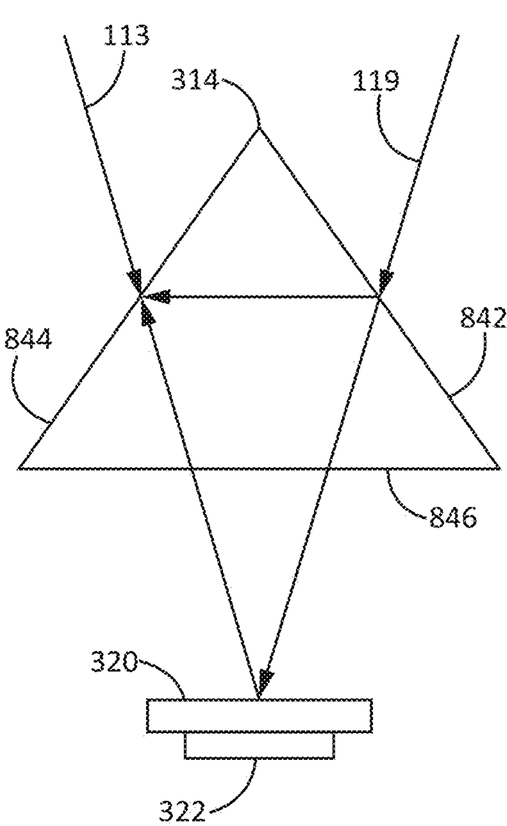

FIGS. 6-8 depict further embodiments of ring resonators that can be used in a magnetometer. Referring first to FIG. 6, resonator 316 is constructed in a "bowtie" cavity configuration in which the resonating pump light 113 and probe light 119 are reflected from four reflecting elements 320A-D. The probe light 119 enters from a probe laser to reflecting element 320A, while pump light 113 enters from a pump laser to reflecting element 320B (and PZT 322). The pump light 113 exits from reflecting element 320C and probe light exits from reflecting element 320D. In this "bowtie" ring resonator 316 configuration, the pump light 113 and probe light 119 are further separated at the output (in addition to the input), which can be advantageous for some applications.

Now referring to FIGS. 7A-7B, which depict different embodiments of a ring resonator with varying number of reflecting elements 320. While both embodiments depict a triangular ring resonator, in FIG. 7A, three reflecting elements 320A, 320B, 320C are used to reflect the probe light 119 and pump light 113 in the resonator cavity. The pump light 113 enters through reflecting element 320B and exits reflecting element 320C and PZT 322 after propagating in the cavity. The probe light 119 enters via reflecting element 320A and also exits reflecting element 320C and PZT 322 after propagating in the cavity. The absorbent material 314 can be coated with an anti-reflective (AR) coating on both sides to reduce intrinsic reflection of the two beams in the material.

In FIG. 7B, an alternative embodiment is depicted in which only two reflecting elements 320A, 320C are used to reflect the probe light 119 and pump light 113 in the cavity. To construct the ring resonator, the absorbent material 314 in this embodiment is configured to serve as an additional reflecting element, in which both the pump light 113 and probe light 119 reflect from the absorbent material 314 to the other reflecting elements 320A, 320C. The internal side 734 ("internal" being defined with respect to the cavity) of the absorbent material 314 is coated with an anti-reflective coating similar to the embodiment of FIG. 7A. However, in this embodiment, the external side 736 is coated with a high-reflective (HR) coating to increase the reflectance of the absorbent material 314 when receiving the propagating pump light 113 and probe light 119 beams in the cavity.

In the embodiments of FIG. 7A and FIG. 7B, one or more of the reflecting elements 320 can be curved.

FIG. 8 depicts an embodiment of a ring resonator 316 that can be used in a magnetometer. In this embodiment, the ring resonator 316 comprises the absorbent material 314 and a reflecting element 320. Specifically, the absorbent material 314 comprises a triangular shape in which the walls serve as reflecting elements that can enable the pump light 113 and probe light 119 to propagate in the absorbent material 314. Here, probe light 119 initially enters through one side 842 of the absorbent material 314 while the pump light 113 enters through another side 844 of the absorbent material 314. Both light beams can exit the absorbent material 314 and be reflected by reflecting element 320 back into the absorbent material 314. To reduce intrinsic reflection in the absorbent material 314, the side 846 in which both light beams can exit the absorbent material 314 is covered with an anti-reflective coating. In contrast, both sides 842 and 844 are covered with a high-reflective coating to enable propagation of both light beams in the absorbent material 314 and to limit cross-coupling with the entering pump light 113 and probe light 119.

Unless otherwise stated, the features depicted or described in one drawing may be used in embodiments described in another drawing. For example, the ring resonator 316 described with respect to FIG. 3 may also be coated with an anti-reflective or high-reflective coating.

The methods and techniques described herein may be implemented at least in part in digital electronic circuitry, or with a programmable processor (for example, a special-purpose processor or a general-purpose processor such as a computer) firmware, software, or in various combinations of each. Apparatus embodying these techniques may include appropriate input and output devices, a programmable processor, and a storage medium tangibly embodying program instructions for execution by the programmable processor. A process embodying these techniques may be performed by a programmable processor executing a program of instructions to perform desired functions by operating on input data and generating appropriate output. The techniques may advantageously be implemented in one or more programs that are executable on a programmable system including at least one programmable processor coupled to receive data and instructions from, and to transmit data and instruction to, a data storage system, at least one input device, and at least one output device. Generally, a processor will receive instructions and data from a read-only memory and/or a random-access memory. Storage devices suitable for tangibly embodying computer program instructions and data include all forma of non-volatile memory, including by way of example semiconductor memory devices, such as erasable programmable read-only memory (EPROM), electrically-erasable programmable read-only memory (EEPROM), and flash memory devices; magnetic disks such as internal hard disks and removable disks; magneto-optical disks; and the like. Any of the foregoing may be supplemented by, or incorporated in, specially-designed application specific integrated circuits (ASICs).

Example Embodiments

Example 1 includes a system, comprising: a probe light source configured to generate probe light; a pump light source configured to generate pump light; a ring resonator optically coupled to the probe light source and the pump light source, wherein the ring resonator comprises: a plurality of reflecting elements, and an absorbent material; and at least one detector coupled to an output of the ring resonator, wherein the at least one detector is configured to receive output light from the output of the ring resonator, wherein the pump light is configured to propagate in the ring resonator at a first intensity and the probe light is configured to propagate in the ring resonator at a second intensity, wherein the absorbent material, in response to optical contact from the pump light at an excitation frequency of the absorbent material, absorbs the probe light propagating in the ring resonator, wherein the second intensity of the probe light changes in response to absorption of the probe light propagating in the ring resonator by the absorbent material, wherein the at least one detector is configured to detect an intensity change of the output light corresponding to absorption of the probe light.

Example 2 includes the system of Example 1, wherein the ring resonator comprises one of a circular resonator, bowtie resonator, or triangular resonator.

Example 3 includes the system of any of Examples 1-2, wherein the probe light and the pump light are input into different portions of the ring resonator.

Example 4 includes the system of any of Examples 1-3, further comprising a piezoelectric material coupled to an output of one of the reflecting elements, wherein the piezoelectric material is configured to tune an optical path length of the ring resonator to maintain resonance with at least one of the probe light and the pump light.

Example 5 includes the system of any of Examples 1-4, wherein the absorbent material is configured to reflect the pump light and the probe light to at least one of the plurality of reflecting elements in the ring resonator.

Example 6 includes the system of any of Examples 1-5, wherein the pump light and the probe light are output from different portions of the ring resonator.

Example 7 includes the system of any of Examples 1-6, wherein at least one of the reflecting elements and the absorbent material is coated with a high reflecting coating to increase reflectivity with respect to the pump light and the probe light propagating in the ring resonator.

Example 8 includes the system of any of Examples 1-7, wherein at least one of the reflecting elements and the absorbent material is coated with an antireflective coating to decrease reflectivity with respect to the pump light and the probe light propagating in the ring resonator.

Example 9 includes an optical circuit, comprising: a probe light source configured to generate probe light; a pump light source configured to generate pump light; a ring resonator optically coupled to the probe light source and the pump light source, wherein the ring resonator comprises: at least one reflecting element, and an absorbent material; and at least one detector coupled to an output of the ring resonator, wherein the at least one detector is configured to receive output light from the output of the ring resonator, wherein the pump light is configured to propagate in the ring resonator at a first intensity and the probe light is configured to propagate in the ring resonator at a second intensity, wherein the absorbent material, in response to optical contact from the pump light at an excitation frequency of the absorbent material, absorbs the probe light propagating in the ring resonator, wherein the second intensity of the probe light changes in response to absorption of the probe light propagating in the ring resonator by the absorbent material, wherein the at least one detector is configured to detect an intensity change of the output light corresponding to absorption of the probe light.

Example 10 includes the optical circuit of Example 9, wherein the absorbent material is optically coupled to the at least one reflecting element, wherein the pump light and the probe light is input into the absorbent material and propagates out of the absorbent material to the at least one reflecting element, wherein at least a portion of the pump light and the probe light reflects from the at least one reflecting element back into the absorbent material.

Example 11 includes the optical circuit of Example 10, wherein the pump light and the probe light enter the absorbent material at different sides, wherein a first side corresponding to input of the pump light and a second side corresponding to input of the second side are coated with a high reflective coating to increase reflectivity with respect to the pump light and the probe light propagating in the absorbent material.

Example 12 includes the optical circuit of any of Examples 10-11, wherein the pump light and the probe light enter the absorbent material at a third side, wherein the third side is coated with an antireflective coating to decrease reflectivity with respect to the pump light and the probe light entering into the absorbent material.

Example 13 includes the optical circuit of any of Examples 9-12, wherein the at least one reflecting element comprises a plurality of reflecting elements, wherein the pump light and the probe light reflect from each of the plurality of reflecting elements, wherein the absorbent material is disposed in the ring resonator between at least two of the plurality of reflecting elements.

Example 14 includes the optical circuit of any of Examples 9-13, wherein the pump light and the probe light overlaps in the ring resonator.

Example 15 includes the optical circuit of any of Examples 9-14, further comprising a piezoelectric material coupled to an output of one of the reflecting elements, wherein the piezoelectric material is configured to tune an optical path length of the ring resonator to maintain resonance with at least one of the probe light and the pump light.

Example 16 includes the optical circuit of any of Examples 9-15, wherein the absorbent material comprises nitrogen vacancy diamond with point defects.

Example 17 includes the optical circuit of any of Examples 9-16, wherein the at least one detector comprises a plurality of detectors, wherein a portion of the probe light and the pump light exit the ring resonator at an output of the at least one reflecting element, wherein a first detector receives the portion of the probe light exiting the ring resonator, wherein a second detector receives the portion of the pump light exiting the ring resonator.

Example 18 includes the optical circuit of any of Examples 9-17, further comprising a controller coupled to the at least one detector, wherein the controller is configured to control a feedback loop between the at least one detector, the pump light source, and the probe light source to remain frequency locked to a resonance frequency of the ring resonator.

Example 19 includes the optical circuit of any of Examples 9-18, wherein the at least one reflecting element comprises a mirror.

Example 20 includes a method, comprising: receiving, at a ring resonator, probe light generated from a probe light source, wherein the ring resonator comprises an absorbent material; receiving, at the ring resonator, pump light at an excitation frequency of the absorbent material, wherein the pump light and the probe light propagate in the ring resonator; receiving radio frequency (RF) emission at a range of frequencies; filtering the probe light from the pump light; detecting an intensity change of the filtered probe light; and determining one or more characteristics of an external magnetic field based on the intensity change of the filtered probe light.

Although specific embodiments have been illustrated and described herein, it will be appreciated by those of ordinary skill in the art that any arrangement, which is calculated to achieve the same purpose, may be substituted for the specific embodiments shown. Therefore, it is manifestly intended that this invention be limited only by the claims and the equivalents thereof.

What is claimed is:

1. A system, comprising:

a probe light source configured to generate probe light;

a pump light source configured to generate pump light;

a ring resonator optically coupled to the probe light source and the pump light source, wherein the ring resonator comprises:

a plurality of reflecting elements, and an absorbent material; and at least one detector coupled to an output of the ring resonator, wherein the at least one detector is configured to receive output light from the output of the ring resonator, wherein the pump light is configured to propagate in the ring resonator at a first intensity and the probe light is configured to propagate in the ring resonator at a second intensity, wherein the absorbent material, in response to optical contact from the pump light at an excitation frequency of the absorbent material, absorbs the probe light propagating in the ring resonator, wherein the second intensity of the probe light changes in response to absorption of the probe light propagating in the ring resonator by the absorbent material, wherein the at least one detector is configured to detect an intensity change of the output light corresponding to absorption of the probe light.

2. The system of claim 1, wherein the ring resonator comprises one of a circular resonator, bowtie resonator, or triangular resonator.

3. The system of claim 1, wherein the probe light and the pump light are input into different portions of the ring resonator.

4. The system of claim 1, further comprising a piezoelectric material coupled to an output of one of the reflecting elements, wherein the piezoelectric material is configured to tune an optical path length of the ring resonator to maintain resonance with at least one of the probe light and the pump light.

5. The system of claim 1, wherein the absorbent material is configured to reflect the pump light and the probe light to at least one of the plurality of reflecting elements in the ring resonator.

6. The system of claim 1, wherein the pump light and the probe light are output from different portions of the ring resonator.

7. The system of claim 1, wherein at least one of the reflecting elements and the absorbent material is coated with a highly reflective coating to increase reflectivity with respect to the pump light and the probe light propagating in the ring resonator.

8. The system of claim 1, wherein at least one of the reflecting elements and the absorbent material is coated with an antireflective coating to decrease reflectivity with respect to the pump light and the probe light propagating in the ring resonator.

9. An optical circuit, comprising:

a probe light source configured to generate probe light;

a pump light source configured to generate pump light;

a ring resonator optically coupled to the probe light source and the pump light source, wherein the ring resonator comprises:

at least one reflecting element, and an absorbent material; and at least one detector coupled to an output of the ring resonator, wherein the at least one detector is configured to receive output light from the output of the ring resonator, wherein the pump light is configured to propagate in the ring resonator at a first intensity and the probe light is configured to propagate in the ring resonator at a second intensity, wherein the absorbent material, in response to optical contact from the pump light at an excitation frequency of the absorbent material, absorbs the probe light propagating in the ring resonator, wherein the second intensity of the probe light changes in response to absorption of the probe light propagating in the ring resonator by the absorbent material, wherein the at least one detector is configured to detect an intensity change of the output light corresponding to absorption of the probe light.

10. The optical circuit of claim 9, wherein the absorbent material is optically coupled to the at least one reflecting element, wherein the pump light and the probe light is input into the absorbent material and propagates out of the absorbent material to the at least one reflecting element, wherein at least a portion of the pump light and the probe light reflects from the at least one reflecting element back into the absorbent material.

11. The optical circuit of claim 10, wherein the pump light and the probe light enter the absorbent material at different sides, wherein a first side corresponding to input of the pump light and a second side corresponding to input of the probe light are coated with a highly reflective coating to increase reflectivity with respect to the pump light and the probe light propagating in the absorbent material.

12. The optical circuit of claim 10, wherein the pump light and the probe light enter the absorbent material at a third side, wherein the third side is coated with an antireflective coating to decrease reflectivity with respect to the pump light and the probe light entering into the absorbent material.

13. The optical circuit of claim 9, wherein the at least one reflecting element comprises a plurality of reflecting elements, wherein the pump light and the probe light reflect from each of the plurality of reflecting elements, wherein the absorbent material is disposed in the ring resonator between at least two of the plurality of reflecting elements.

14. The optical circuit of claim 9, wherein the pump light and the probe light overlaps in the ring resonator.

15. The optical circuit of claim 9, further comprising a piezoelectric material coupled to an output of the at least one reflecting elements, wherein the piezoelectric material is configured to tune an optical path length of the ring resonator to maintain resonance with at least one of the probe light and the pump light.

16. The optical circuit of claim 9, wherein the absorbent material comprises a nitrogen vacancy diamond with point defects.

17. The optical circuit of claim 9, wherein the at least one detector comprises a plurality of detectors, wherein a portion of the probe light and the pump light exit the ring resonator at an output of the at least one reflecting element, wherein a first detector receives the portion of the probe light exiting the ring resonator, wherein a second detector receives the portion of the pump light exiting the ring resonator.

18. The optical circuit of claim 9, further comprising a controller coupled to the at least one detector, wherein the controller is configured to control a feedback loop between the at least one detector, the pump light source, and the probe light source to remain frequency locked to a resonance frequency of the ring resonator.

19. The optical circuit of claim 9, wherein the at least one reflecting element comprises a mirror.

* * * * *